United States Patent
Um et al.

(10) Patent No.: US 9,147,757 B2
(45) Date of Patent: Sep. 29, 2015

(54) POWER SEMICONDUCTOR DEVICE AND METHOD FOR MANUFACTURING THE SAME

(71) Applicant: SAMSUNG ELECTRO-MECHANICS CO., LTD., Suwon (KR)

(72) Inventors: Kee Ju Um, Suwon (KR); Dong Soo Seo, Suwon (KR); Chang Su Jang, Suwon (KR); In Hyuk Song, Suwon (KR); Jaehoon Park, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 0 days.

(21) Appl. No.: 13/874,038

(22) Filed: Apr. 30, 2013

(65) Prior Publication Data
US 2014/0159106 A1    Jun. 12, 2014

(30) Foreign Application Priority Data
Dec. 6, 2012   (KR) .......................... 10-2012-0141454

(51) Int. Cl.
| H01L 29/74 | (2006.01) |
| H01L 29/739 | (2006.01) |
| H01L 29/66 | (2006.01) |
| H01L 29/40 | (2006.01) |
| H01L 29/06 | (2006.01) |

(52) U.S. Cl.
CPC ........ *H01L 29/7395* (2013.01); *H01L 29/0619* (2013.01); *H01L 29/0638* (2013.01); *H01L 29/404* (2013.01); *H01L 29/66333* (2013.01)

(58) Field of Classification Search
CPC ...................... H01L 29/7395; H01L 29/66333
USPC .......... 257/153, 148, 376, 519; 438/140, 454
See application file for complete search history.

(56) References Cited

U.S. PATENT DOCUMENTS

| 6,160,306 A | 12/2000 | Kim et al. | |
| 2005/0156284 A1* | 7/2005 | Schmidt | ........................ 257/626 |
| 2006/0033153 A1* | 2/2006 | Onishi et al. | ................... 257/328 |
| 2007/0052014 A1 | 3/2007 | Takahashi | |
| 2009/0173995 A1* | 7/2009 | Takahashi | ...................... 257/330 |
| 2011/0272735 A1* | 11/2011 | Schmidt | ........................ 257/139 |
| 2012/0126284 A1 | 5/2012 | Matsuda | |

FOREIGN PATENT DOCUMENTS

| JP | 2005-175161 | 6/2005 |
| KR | 1999-0085645 | 12/1999 |
| KR | 10-2007-0024365 | 3/2007 |

(Continued)

OTHER PUBLICATIONS

Korean Office Action issued Nov. 22, 2013 in corresponding Korean Application 10-2012-0141454.

(Continued)

*Primary Examiner* — Tu-Tu Ho

(57) ABSTRACT

There is provided a power semiconductor device, including: a first conductive type drift layer, a second conductive type termination layer formed on an upper portion of an edge of the drift layer, and a high concentration first conductive type channel stop layer formed on a side surface of the edge of the drift layer.

6 Claims, 2 Drawing Sheets

(56) References Cited

FOREIGN PATENT DOCUMENTS

| | | |
|---|---|---|
| KR | 10-2011-0052836 | 5/2011 |
| KR | 10-2012-0029477 | 3/2012 |

OTHER PUBLICATIONS

Korean Office Action issued Aug. 8, 2014 in corresponding Korean Patent Application No. 10-2012-0141454.

* cited by examiner

POWER SEMICONDUCTOR DEVICE AND METHOD FOR MANUFACTURING THE SAME

CROSS-REFERENCE TO RELATED APPLICATIONS

This application claims the priority of Korean Patent Application No. 10-2012-0141454 filed on Dec. 6, 2012, in the Korean Intellectual Property Office, the disclosure of which is incorporated herein by reference.

BACKGROUND OF THE INVENTION

1. Field of the Invention

The present invention relates to a power semiconductor device and a method for manufacturing the same.

2. Description of the Related Art

An insulated gate bipolar transistor (IGBT) is a transistor in which a gate is manufactured using metal oxide silicon (MOS) and a p-type collector layer is formed on a rear surface thereof to thereby provide bipolarity.

Since a power metal oxide silicon field emission transistor (MOSFET) according to the related art has been developed, MOSFETs have been used in regions requiring fast switching characteristics.

However, due to structural limitations of the MOSFET, a bipolar transistor, a thyristor, gate turn-off thyristors (GTOs), and the like have been used in regions requiring high voltage.

The IGBT having low forward loss and fast switching speed characteristics has been widely applied to fields in which is impossible to implement with an existing thyristor, a bipolar transistor, a metal oxide silicon field emission transistor (MOSFET), or the like.

Describing an operational principle of the IGBT, in the case in which the IGBT element is turned on, an anode thereof may have a voltage higher than that of a cathode applied thereto, and in the case in which a gate electrode a voltage higher than a threshold voltage of the element applied thereto, polarity of a surface of a p-type body region disposed at a lower stage of the gate electrode is reversed to thereby form a n-type channel.

Electron current injected into a drift region through a channel derives an injection of hole current from a high concentration p-type collector layer located in a lower portion of the IGBT element similar to a base current of the bipolar transistor.

Due to a high concentration injection of a few carriers as described above, conductivity modulation in which conductivity is increased in the drift region from tens to hundreds of times occurs.

Unlike the MOSFET, since resistive components in the drift region become significantly smaller due to conductivity modulation, the IGBT may have a significantly high voltage applied thereto.

Current flowing toward the cathode is divided into an electron current flowing through the channel and a hole current flowing through a junction between the p-type body and the n-type drift region.

The IGBT is a pnp structure between the anode and the cathode in the structure of the substrate. Therefore, since a diode is not embodied in the IGBT unlike the MOSFET, separate diodes should be connected in inverse-parallel.

The above-mentioned IGBT has main characteristics such as maintenance of blocking voltage, a decrease in conduction loss and an increase in a switching speed.

As the power semiconductor device has a large capacitance, a size of a chip may be increased in order to generate more current, and as the size of a termination region covering an inverse-voltage region is increased, it becomes difficult to secure reliability.

Users gradually require power semiconductor devices capable of withstanding higher transient states.

Therefore, research into structure or processes for forming power semiconductor devices capable of securing high reliability has been recently undertaken.

Patent Document 1 described in the following related art document relates to a diode of a semiconductor device.

The invention described in Patent Document 1 has a configuration different from that of the present invention and the present invention has an effect different from the invention disclosed in the Patent Document 1 and has a more significant effect than the invention disclosed in Patent document 1.

RELATED ART DOCUMENT (Patent Document 1) Korean Patent Laid-Open Publication No. 1999-0085645

SUMMARY OF THE INVENTION

An aspect of the present invention provides a power semiconductor device capable of securing reliability.

Specifically, another aspect of the present invention provides a power semiconductor device capable of preventing leakage current from flowing while maintaining a blocking voltage.

According to an aspect of the present invention, there is provided a power semiconductor device, including: a first conductive type drift layer; a second conductive type termination layer formed on an upper portion of an edge of the drift layer; and a high concentration first conductive type channel stop layer formed on a side surface of the edge of the drift layer.

The channel stop layer may be formed to have a depth greater than that of the termination layer.

The power semiconductor device may further a channel stop metal layer formed to cover the termination layer and the channel stop layer at the edge of the drift layer.

The power semiconductor device may further include a second conductive type collector layer formed on a lower portion of the drift layer.

The channel stop metal layer and the collector layer may be electrically connected to each other.

The first conductive type drift layer may be an n-type drift layer, the second conductive type termination layer may be a p-type termination layer, and the first conductive type channel stop layer may be an n-type channel stop layer.

According to an aspect of the present invention, there is provided a method for manufacturing a power semiconductor device, the method including: providing a drift layer having an oxide layer and a second conductive type electric field limitation ring formed on an upper portion thereof; etching a trench in the drift layer; forming a channel stop layer by injecting a high concentration first conductive type impurity into an edge of the drift layer having the trench formed therein; forming a polysilicon layer on the drift layer having the channel stop layer formed therein; and forming a termination layer by injecting a second conductive type impurity into the upper portion of the drift layer having the polysilicon layer formed thereon.

The etching of the trench may be performed simultaneously with etching a trench gate of the power semiconductor device.

The channel stop layer may be formed to have a depth greater than that of the termination layer.

The method may further include, after the forming of the termination layer, forming a channel stop metal layer to cover the termination layer and the channel stop layer at the edge of the drift layer.

The method may further include, after the forming of the channel stop metal layer, forming a collector layer on a lower portion of the drift layer, by injecting the second conductive type impurity.

The method may further include, after the forming of the collector layer, electrically connecting the channel stop metal layer and the collector layer.

The first conductive type impurity may be an n-type impurity, the second conductive impurity may be a p-type impurity, and the second conductive type electric field limitation ring may be an n-type electric field limitation ring.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
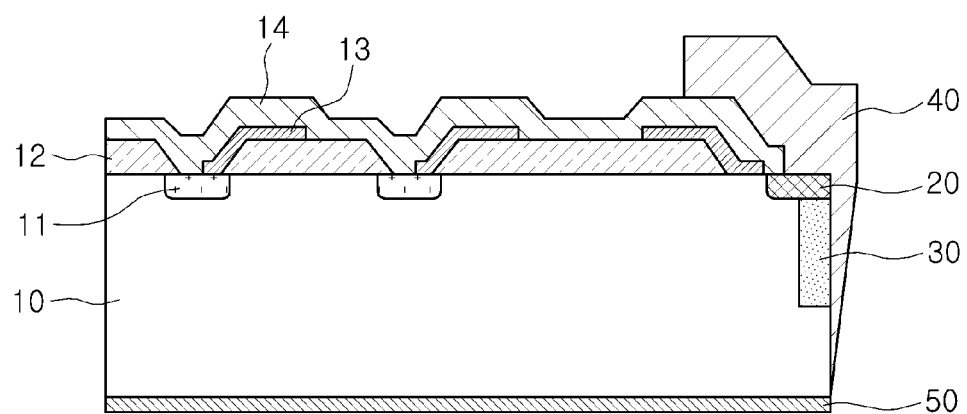
FIG. 1 is a cross-sectional view of a power semiconductor device according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

A power switch may be implemented by any one of a power MOSFET, an IGBT, several types of thyristors, and those similar to the above-mentioned things.

Most of new technologies disclosed in the present invention will be described based on the IGBT.

However, several embodiments of the present invention disclosed in the present invention are not limited to the IGBT, but may be generally applied to different forms of power switch technologies including the power MOSFET and several forms of thyristors, in addition to a diode, for example.

Further, embodiments of the present invention may be illustrated as those including specific p-type and n-type regions.

However, embodiments of the present invention may also be equally applied to elements in which conductive types of several regions disclosed in the present invention are opposite to those of the embodiments of the present invention.

In addition, the n-type and the p-type used in the present invention may be defined as a first conductive type and a second conductive type. Meanwhile, the first conductive type and the second conductive type mean conductive types different from each other.

In addition, generally, '+' means a high-concentration doped state and '−' means a low-concentration doped state.

FIG. 1 is a cross-sectional view of a power semiconductor device according to an embodiment of the present invention.

Referring to FIG. 1, the power semiconductor device according to the embodiment of the present invention may include an n-type drift layer 10, a p-type termination layer 20 formed on an upper portion of an edge of the drift layer 10, and a high concentration n-type channel stop layer 30 formed on a side surface of the edge of the drift layer 10.

An ideal blocking voltage of the power semiconductor device is basically determined by a thickness of the drift layer 10 and a concentration of impurities.

In order to improve the blocking voltage, the thickness of the drift layer 10 needs to increase and the concentration of the impurities needs to decrease. In this case, since voltage Vce (sat) of the power semiconductor device increases, an appropriate condition is required.

Therefore, in order to maintain the blocking voltage by alleviating a concentration of an electric field in the edge of the element, an electric field limitation ring 11 may be formed on the upper portion of the drift layer 10.

The electric field limitation ring 11 may be formed by injecting a p-type impurity.

Since the electric field limitation ring 11 is formed by injecting the p-type impurity, a depleted layer formed in the drift layer 10 is changed to have a smooth shape at the time of operating the element, such that the concentration of the electric field is alleviated, whereby the blocking voltage may be maintained.

The number or displacement interval of electric field limitation rings 11 may be designed according to blocking voltage characteristics of the power semiconductor device.

The blocking voltage characteristics of the power semiconductor device may be improved by increasing the number of electric field limitation rings 11.

However, since an area of the power semiconductor device is limited, the number of electric field limitation rings 11 needs to be appropriately adjusted.

The upper portion of the edge of the drift layer 10 may be provided with the p-type termination layer 20.

The p-type termination layer 20 may be formed simultaneously with a well region in an active region of the power semiconductor device.

The p-type termination layer 20 is formed by injecting the p-type impurity into a portion in which a polysilicon layer 13 is not formed.

That is, since the p-type termination layer 20 is formed, the depleted layer formed in the drift layer 10 is changed to have the smooth shape, such that the concentration of the electric field is alleviated, whereby the blocking voltage may be maintained.

However, since the p-type termination layer 20 is formed at the edge of the drift layer 10, the depleted layer is formed in a deeper position of the drift layer 10, such that the depleted layer contacts a cut surface of the power semiconductor device.

In the case in which the depleted layer contacts the cut surface of the drift layer 10, leakage current is generated in the power semiconductor device, thereby deteriorating reliability.

Therefore, in order to prevent the depleted layer from extending to the edge of the drift layer 10 due to the p-type termination layer 20 formed as described above, the power semiconductor device according to the embodiment of the present invention may include the high concentration n-type channel stop layer 30 formed on the side surface of the edge of the drift layer 10.

Since the high concentration n-type channel stop layer 30 is formed by injecting an high concentration n-type impurity, it may prevent the depleted layer extending to the deeper position of the drift layer 10 due to the formation of the p-type termination layer 20 from contacting the side surface of the power semiconductor device.

The high concentration n-type channel stop layer 30 may be formed to have a depth greater than that of the p-type termination layer 20.

According to the formation of the p-type termination layer 20, the depth of the depleted layer becomes deeper as compared to the power semiconductor device in which the p-type termination layer 20 is not formed.

Therefore, in the case in which the high concentration n-type channel stop layer 30 is formed to have the depth greater than that of the p-type termination layer 20, the depleted layer may be prevented from being extended to thereby contact the side surface of the power semiconductor device.

The power semiconductor device according to the embodiment of the present invention may further include a channel stop metal layer 40 formed to cover the p-type termination layer 20 and the high concentration n-type channel stop layer 30 at the edge of the drift layer 10.

The power semiconductor device according to the embodiment of the present invention may further include a second conductive type collector layer 50 formed on a lower portion of the drift layer 10.

The collector layer 50 provides a hole to the drift layer 10 at the time of operating the power semiconductor device to thereby derive a conductivity modulation phenomenon, whereby conduction loss may be sharply decreased.

The channel stop metal layer 40 and the collector layer 50 may be electrically connected to each other.

Since the channel stop metal layer 40 and the collector layer 50 are electrically connected to each other, the channel stop metal layer 40 may have the same potential as the collector layer 50.

That is, since the channel stop metal layer 40 has the same potential as the collector layer 50, a barrier role preventing the expansion of the depleted layer may be reinforced.

Therefore, the leakage current due to the expansion of the depleted layer may be prevented.

Figure 2:
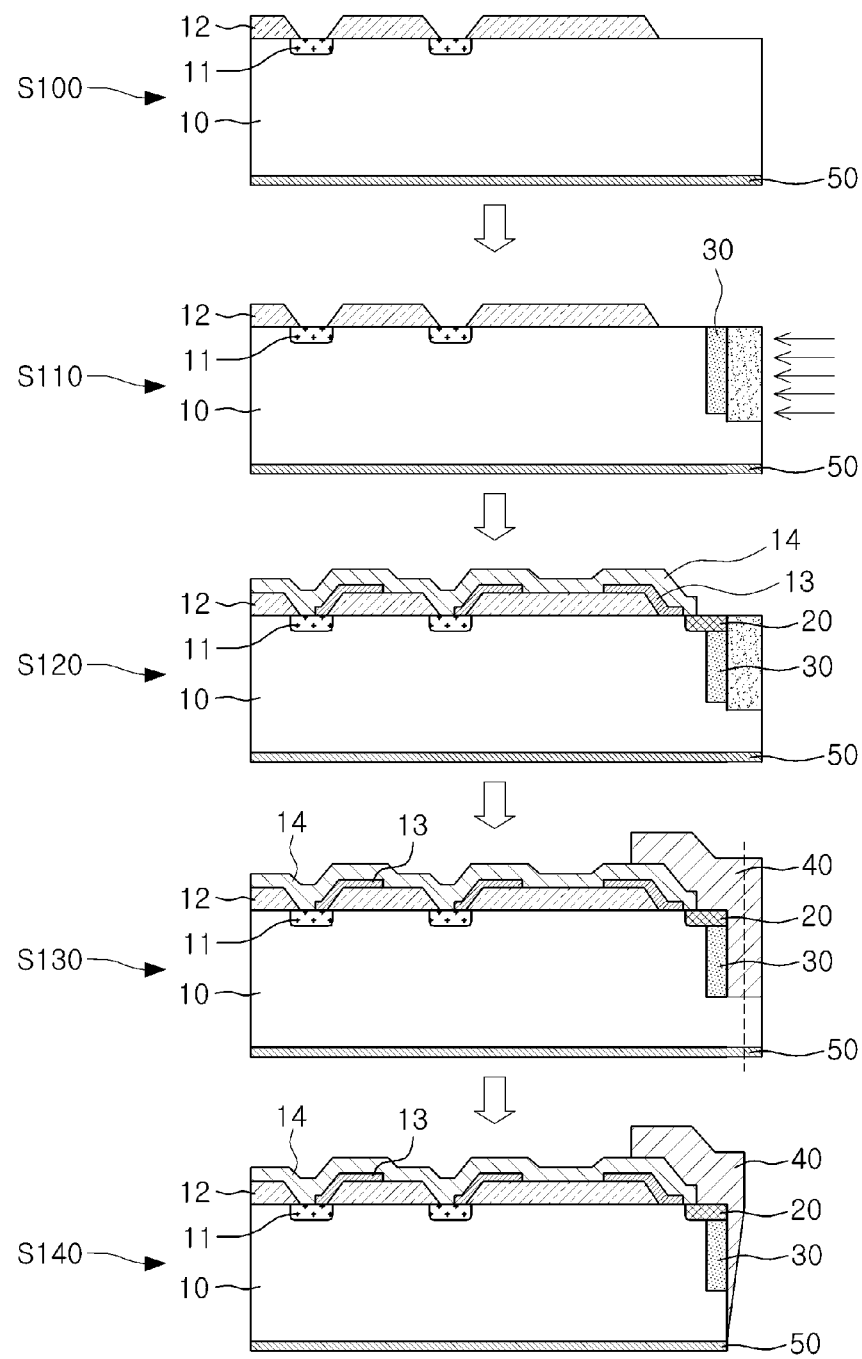
FIG. 2 is a view showing a process for manufacturing the power semiconductor device according to the embodiment of the present invention.

FIG. 2 is a view showing a process for manufacturing the power semiconductor device according to the embodiment of the present invention.

Referring to FIG. 2, the method for manufacturing the power semiconductor device according to the embodiment of the present invention may include providing the drift layer 10 having a oxide layer 12 and the second conductive type electric field limitation ring 11 formed on the upper portion thereof (S100), etching a trench in the drift layer 10 (S110), forming the channel stop layer 30 by injecting a high concentration first conductive type impurity into an edge of the drift layer 10 having the trench formed therein (S110), forming a polysilicon layer 13 on the drift layer 10 having the channel stop layer 30 formed therein (S120), and forming the termination layer 20 by injecting the second conductive type impurity into the upper portion of the drift layer 10 having the polysilicon layer 13 formed thereon.

The etching of the trench (S110) may be performed simultaneously with etching a trench gate of the power semiconductor device.

A process of adding a separate trench is not required in the embodiment, as compared to a method for manufacturing a trench gate type of an insulated gate bipolar transistor (IGBT) according to the related art.

Therefore, an additional cost according to the etching of the trench (S110) is not generated.

The channel stop layer 30 may be formed to have a depth greater than that of the p-type termination layer 20.

The channel stop layer 30 may be formed by injecting the high concentration n-type impurity into the side surface of the drift layer 10 having the trench formed therein.

Therefore, the depth of the channel stop layer 30 is determined by a depth of the trench.

That is, in the case in which the n-type impurity is injected into an upper surface of the drift layer 10 in order to form the channel stop layer 30, the channel stop layer 30 may be formed only at a very small depth.

Further, in order to form the channel stop layer 30 to have the depth greater than that of the p-type termination layer 20 to be described below, time and costs required for injecting the n-type impurity significantly increase.

However, since the depth of the channel stop layer 30 is determined by the depth of the trench, the channel stop layer 30 may be formed to have the depth greater than that of the p-type termination layer 20 by only a simple etching process and the injection of the n-type impurity.

Generally, since the trench and the trench gate of the element may be simultaneously formed, the depth of the channel stop layer 30 may be the same as the trench gate.

However, the channel stop layer 30, that is, a layer for preventing the expansion of the depleted layer formed in the drift layer 10, may be formed to have the depth greater than the depth at which the depleted layer is formed.

Therefore, in order to more deeply form the channel stop layer 30, a process of etching the trench may be additionally added.

The termination layer 20 may be formed on the channel stop layer 30.

The termination layer 20 may be formed simultaneously with a p-type well of the device.

The termination layer 20 is formed by injecting the p-type impurity into the upper surface of the drift layer 10 in which a polysilicon layer 13 is not formed.

The termination layer 20 is formed in the vicinity of the edge of the element in which the polysilicon layer 13 is not formed, such that the depleted layer in the vicinity of the edge of the element may be more deeply extended.

Therefore, in the case in which the channel stop layer 30 is not formed, the depleted layer contacts a cut surface of the power semiconductor device, thereby generating the leakage current.

As the leakage current occurs, reliability of the power semiconductor device decreases.

After the forming of the termination layer 20 (S120), the method may further include forming the channel stop metal layer 40 formed to cover termination layer 20 and the channel stop layer 30 at the edge of the drift layer 10 (S130).

The channel stop metal layer 40 may be formed simultaneously with a process of forming a gate metal layer or an emitter metal layer.

Therefore, a separate masking process or a patterning process is not required, such that additional cost does not occur.

The channel stop metal layer 40 may be formed while filling the trench.

Since the channel stop metal layer 40 is formed in the trench, the channel stop metal layer 40 and the channel stop layer 30 contact each other.

In addition, since the channel stop metal layer 40 is generally formed by a deposition method, it may be formed on an exposed portion of the p-type termination layer 20.

After the forming of the channel stop metal layer 40 (S130), the method may further include forming a collector layer 50 formed at the lower portion of the drift layer 10 by injecting the second conductive type impurity (S130).

After the forming of the collector layer 50 (S130), the method may further include electrically connecting between the channel stop metal layer 40 and the collector layer 50 (S140).

The power semiconductor device may further include a connection part for electrically connecting between the collector layer 50 and the channel stop metal layer 40.

The collector layer 50 and the channel stop metal layer 40 may be electrically connected to each other using a deformation of the channel stop metal layer 40 generated along the cut surface during cutting of the power semiconductor device without having a separate additional process.

Therefore, the collector layer 50 and the channel stop metal layer 40 are electrically connected to each other without using the separate additional process, whereby economical efficiency may be secured.

As set forth above, according to the embodiment of the present invention, the above-mentioned problems may be solved.

Specifically, according to the embodiment of the present invention, a power semiconductor device in which the blocking voltage is maintained by forming a termination layer and the leakage current due to an expansion of a depleted layer is prevented by forming a channel stop layer on an upper portion of an edge of the drift layer can be provided.

While the present invention has been shown and described in connection with the embodiments, it will be apparent to those skilled in the art that modifications and variations can be made without departing from the spirit and scope of the invention as defined by the appended claims.

What is claimed is:

1. A power semiconductor device, comprising:
   a drift layer of a first conductivity type;
   a termination layer of a second conductivity type formed on an upper portion of an edge in a length direction of the drift layer;
   a high concentration channel stop layer of the first conductivity type formed on a side surface of the edge in the length direction of the drift layer; and
   a channel stop metal layer formed to cover the termination layer and the channel stop layer at the edge of the drift layer.

2. The power semiconductor device of claim 1, wherein the channel stop layer is formed to have a depth, from a surface of the drift layer, greater than that of the termination layer.

3. The power semiconductor device of claim 1, further comprising a collector layer of the second conductivity type formed on a lower portion of the drift layer.

4. The power semiconductor device of claim 3, wherein the channel stop metal layer and the collector layer are electrically connected to each other.

5. The power semiconductor device of claim 1, wherein the drift layer is an n-type drift layer, the termination layer is a p-type termination layer, and the channel stop layer is an n-type channel stop layer.

6. A power semiconductor device, comprising:
   a drift layer of a first conductivity type;
   a termination layer of a second conductivity type formed on an upper portion of an edge in a length direction of the drift layer;
   a high concentration channel stop layer of the first conductivity type formed on a side surface of the edge in the length direction of the drift layer;
   a channel stop metal layer formed to cover the termination layer and the channel stop layer at the edge of the drift layer; and
   a collector layer of the second conductivity type formed on a lower portion of the drift layer and electrically connected to the channel stop metal layer.

* * * * *